United States Patent
Xu et al.

(10) Patent No.: US 11,644,974 B2
(45) Date of Patent: May 9, 2023

(54) TIME-SHARING WAVE RECORDING METHOD

(71) Applicant: Delta Electronics (Shanghai) Co., Ltd., Shanghai (CN)

(72) Inventors: Guojin Xu, Shanghai (CN); Guoqiao Shen, Shanghai (CN); Yunfeng Liu, Shanghai (CN); Qingsong Tao, Shanghai (CN); Changliang Liu, Shanghai (CN); Jinfa Zhang, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 254 days.

(21) Appl. No.: 16/655,045

(22) Filed: Oct. 16, 2019

(65) Prior Publication Data

US 2020/0142592 A1 May 7, 2020

(30) Foreign Application Priority Data

Nov. 1, 2018 (CN) .......................... 201811296104.6

(51) Int. Cl.
*G06F 1/04* (2006.01)
*G06F 3/05* (2006.01)
(Continued)

(52) U.S. Cl.
CPC ....... *G06F 3/0604* (2013.01); *G05B 23/0221* (2013.01); *G06F 1/04* (2013.01);
(Continued)

(58) Field of Classification Search
CPC . G06F 3/0604; G06F 3/05; G06F 1/04; G06F 3/0673; G06F 3/0635;
(Continued)

(56) References Cited

FOREIGN PATENT DOCUMENTS

| CN | 1492583 A | 4/2004 |
|----|-----------|--------|
| CN | 100485734 C * | 5/2009 |

(Continued)

OTHER PUBLICATIONS

Model 6810 Waveform Recorder (Operator's Manual, Jan. 1990) (Year: 1990).*

(Continued)

*Primary Examiner* — Daniel R Miller
*Assistant Examiner* — Christian T Bryant
(74) *Attorney, Agent, or Firm* — Kirton McConkie; Evan R. Witt

(57) ABSTRACT

A time-sharing wave recording method is provided. Firstly, N1 operating variables are selected, and the storage addresses of the N1 operating variables are mapped to N1 index variables. Then, N2 record channels in a sequential relationship are provided, and a mapping relationship between each record channel and the N1 index variables is established. Then, the values of the operating variables are assigned to a first record channel of the N2 record channels in response to a rising edge of a pulse of a clock signal and a start triggering signal, the values of the operating variables are sequentially assigned to the rest of the N2 record channels in response to a rising edge of each pulse of the clock signal and the start triggering signal, and the assigned values of the operating variables for the N2 record channels are recorded to the memory.

10 Claims, 7 Drawing Sheets

(51) Int. Cl.
- *G01R 31/40* (2020.01)
- *G05B 15/00* (2006.01)
- *G06F 3/06* (2006.01)
- *G06F 12/02* (2006.01)
- *G05B 23/02* (2006.01)

(52) U.S. Cl.
CPC .............. *G06F 3/05* (2013.01); *G06F 3/0635* (2013.01); *G06F 3/0673* (2013.01); *G06F 12/023* (2013.01); *G01R 31/40* (2013.01); *G05B 15/00* (2013.01); *G06F 3/0659* (2013.01)

(58) Field of Classification Search
CPC . G06F 12/023; G06F 3/0659; G05B 23/0221; G05B 15/00; G01R 31/40
See application file for complete search history.

(56) References Cited

FOREIGN PATENT DOCUMENTS

| | | | | |
|---|---|---|---|---|
| CN | 101430561 | A | | 5/2009 |
| CN | 201312143 | Y | * | 9/2009 |
| CN | 101847864 | A | | 9/2010 |
| CN | 101944136 | A | | 9/2010 |
| CN | 102111261 | A | | 6/2011 |
| CN | 102213953 | A | | 10/2011 |
| CN | 103076539 | A | | 5/2013 |
| CN | 103683314 | A | | 3/2014 |
| CN | 103713171 | A | | 4/2014 |
| CN | 103986454 | A | | 8/2014 |
| CN | 104122464 | A | | 10/2014 |
| CN | 104660372 | A | | 5/2015 |
| CN | 103683314 | B | * | 8/2015 |
| CN | 204758755 | U | | 11/2015 |
| CN | 105334471 | A | * | 2/2016 |
| CN | 106018993 | A | | 10/2016 |
| CN | 106230404 | A | | 12/2016 |
| CN | 106647494 | A | | 5/2017 |
| CN | 206353188 | U | | 7/2017 |

OTHER PUBLICATIONS

Programming Guide (Programming Guide GPIB DC Power Supplies Agilent Technologies Models 664xA, 665xA, 667xA, 668xA, and 669xA, Agilent Technologies, Jul. 2001) (Year: 2001).*

Zhao Yucan et al. High Speed Acquisition and Recording System Design for Multi-channel, Electric Power Engineering Technology, May 12, 2017, pp. 119-123.

Design of Multi-channel Oscilloscope Based on Virtual Instrument Platform, Process Automation Instrumention, vol. 28, No. 2, Feb. 2007, pp. 61-64.

* cited by examiner $$\begin{bmatrix} CH1(0) & CH1(1) & \cdots & CH1(M) \\ CH2(0) & CH2(1) & \cdots & CH2(M) \\ \vdots & \vdots & & \vdots \\ CHN2(0) & CHN2(1) & \cdots & CHN2(M) \end{bmatrix}_{M+1,N2}$$

FIG. 6

TIME-SHARING WAVE RECORDING METHOD

FIELD OF THE INVENTION

The present application relates to a time-sharing wave recording method, and more particularly to a time-sharing wave recording method for an embedded system of a power supply apparatus.

BACKGROUND OF THE INVENTION

An embedded system is usually embedded in a control unit of an integrated power supply apparatus. The embedded system is used for providing control signals to the electronic components in the same apparatus while achieving the monitoring and communicating functions. Therefore, it is important to increase the safety, reliability and performance of the power supply apparatus with the embedded system.

During the operations of the power supply apparatus, the power supply apparatus may have fault or malfunction. In order to quickly diagnose and locate the fault source, the conventional power supply apparatus is additionally equipped with a wave recording device to record the operating data of the power supply apparatus. After these operating data recorded by the wave recording device are analyzed and read, the present operating condition or the previous operating condition of the power supply apparatus is recovered and the possible causes of the abnormal condition are deduced.

However, since the conventional power supply apparatus is additionally equipped with the wave recording device and the wave recording device is independent from the control unit of the power supply apparatus, the developing time and cost are increased. Since the wave recording device is independent from the control unit of the power supply apparatus, the wave recording device is only able to record the operating data outside the power supply apparatus. For example, the wave recording device is only able to record the voltages, currents or other physical quantities of the environment. The wave recording device cannot record the characteristic variables (e.g., the variables used for system loop control) of the control unit of the power supply apparatus. Moreover, the wave recording device cannot analyze and process the above-mentioned characteristic variables.

Therefore, there is a need of providing a time-sharing wave recording method so as to overcome the drawbacks of the conventional technologies.

SUMMARY OF THE INVENTION

The present application provides a time-sharing wave recording method for an embedded system of a power supply apparatus. Since the power supply apparatus is not additionally equipped with a wave recording device to record the operating data of the power supply apparatus, the associated cost and time are saved. In addition, the operating variable recorded by the time-sharing wave recording method can be further analyzed and processed.

In accordance with an aspect of the present application, a time-sharing wave recording method for an embedded system of a control unit of a power supply apparatus is provided. The embedded system includes a memory. The time-sharing wave recording method includes the following steps. In a step (a), a plurality of operating variables defined in the embedded system, N1 operating variables are selected from the plurality of operating variables so as to be recorded, and the storage addresses of the N1 operating variables are mapped to N1 index variables, wherein N1 is a positive integer. In a step (b), N2 record channels in a sequential relationship are provided, and a mapping relationship between each record channel and arbitrarily-selected index variables of the N1 index variables is established, wherein N2 is a positive integer. In a step (c), the values of the operating variables corresponding to the mapped index variables are assigned to a first record channel of the N2 record channels in response to a rising edge of a pulse of the clock signal from the embedded system and a start triggering signal, the values of the operating variables corresponding to the mapped index variables are sequentially assigned to the rest of the N2 record channels in response to a rising edge of each pulse of the clock signal and the start triggering signal, and the assigned values of the operating variables for the N2 record channels are recorded to the memory. The procedure of assigning the values of the operating variables to the record channels is stopped in response to a stop triggering signal.

The above contents of the present application will become more readily apparent to those ordinarily skilled in the art after reviewing the following detailed description and accompanying drawings, in which:

BRIEF DESCRIPTION OF THE DRAWINGS

FIG. 6 is a matrix indicating the record results of (M+1) discrete sampling operations of the N2 record channels.

DETAILED DESCRIPTION OF THE PREFERRED EMBODIMENT

The present application will now be described more specifically with reference to the following embodiments. It is to be noted that the following descriptions of preferred embodiments of this application are presented herein for purpose of illustration and description only. It is not intended to be exhaustive or to be limited to the precise form disclosed.

Figure 1:
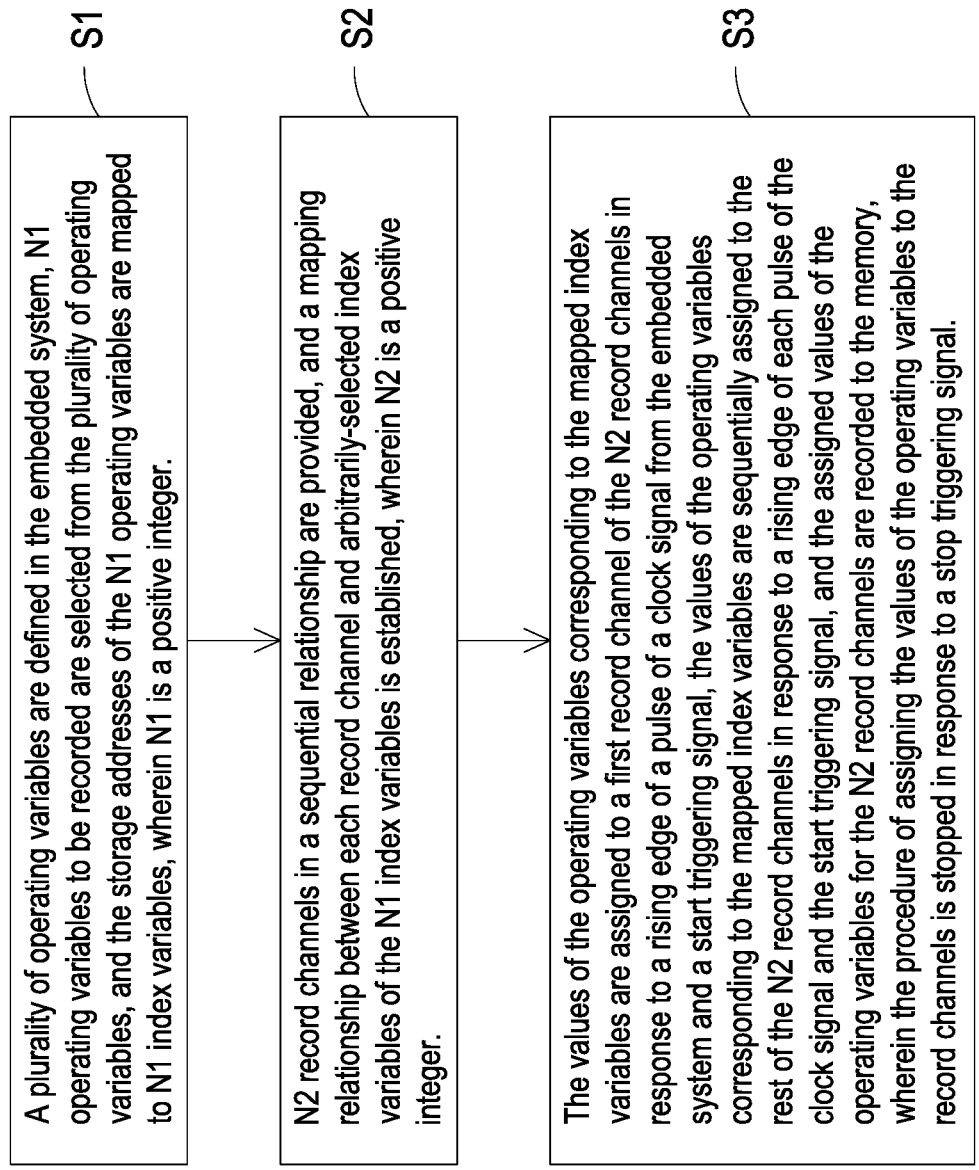
FIG. 1 is a flowchart illustrating a time-sharing wave recording method according to an embodiment of the present application.
Figure 2:
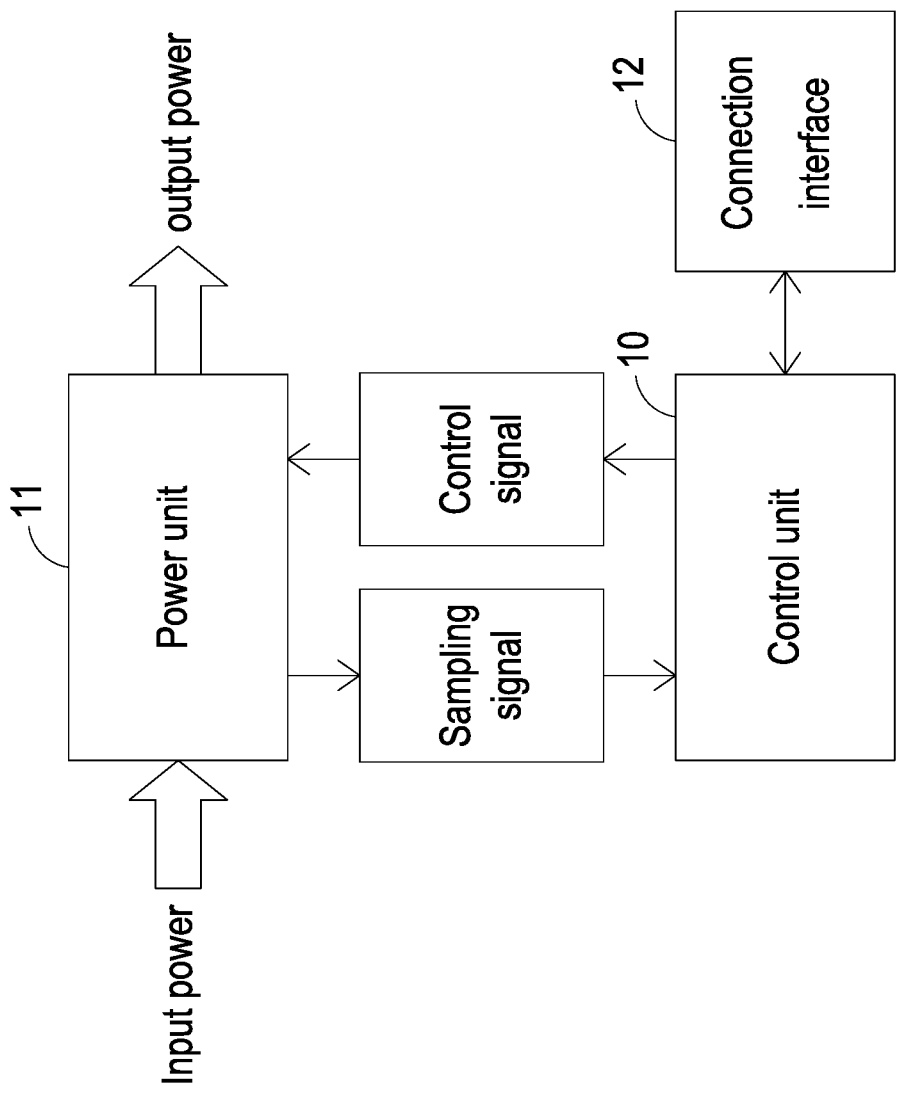
FIG. 2 is a schematic functional block diagram illustrating the architecture of a power supply apparatus using the time-sharing wave recording method as shown in FIG. 1.
Figure 3:
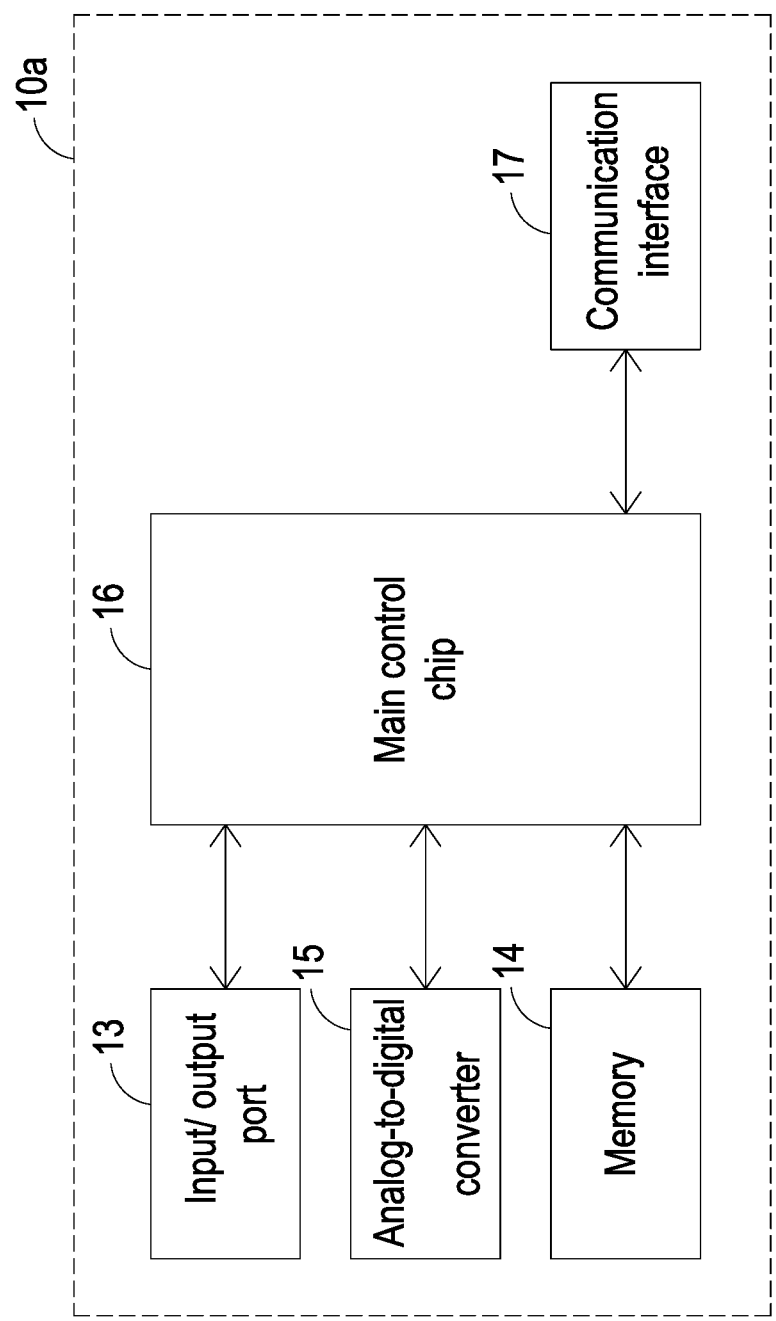
FIG. 3 is a schematic functional block diagram illustrating the architecture of an embedded system in a control unit of the power supply apparatus as shown in FIG. 2.

Please refer to FIGS. 1, 2 and 3. FIG. 1 is a flowchart illustrating a time-sharing wave recording method according to an embodiment of the present application. FIG. 2 is a schematic functional block diagram illustrating the architecture of a power supply apparatus using the time-sharing wave recording method as shown in FIG. 1. FIG. 3 is a schematic functional block diagram illustrating the architecture of an embedded system in a control unit of the power supply apparatus as shown in FIG. 2. As shown in FIG. 2, the power supply apparatus 1 includes a control unit 10, a power unit 11 and a connection interface 12. As shown in FIG. 3, the control unit 10 includes an embedded system 10a. The time-sharing wave recording method is applied to the embedded system 10a of the control unit 10.

The power unit 11 is used for converting an input power into an output power. The output power is provided to a load (not shown) outside the power supply apparatus 1. For example, the load includes a communication device and/or a data storage device.

The control unit 10 is electrically connected with the power unit 11 and issues a control signal to control the power unit 11. The control unit 10 includes at least one embedded system 10a. The embedded system 10a receives a sampling signal from the power supply apparatus 1. For example, the sampling signal contains an input voltage signal, an input current signal, an output voltage signal, an output current signal and/or a temperature signal. According to the sampling signal, the control signal is correspondingly adjusted and the power unit 11 is controlled according to the control signal. It is noted that the functions of different embedded systems may be identical or different. That is, the functions of different embedded systems may be set according to the practical requirements. Moreover, the control unit 10 further generates a clock signal with a plurality of pulses.

In this embodiment, the power supply apparatus 1 further includes a connection interface 12. The connection interface 12 is electrically connected with the control unit 10. The control unit 10 is in communication with the external load through the connection interface 12.

As shown in FIG. 3, the embedded system 10a of the control unit 10 includes an input/output port 13, a memory 14, an analog-to-digital converter 15, a main control chip 16 and a communication interface 17. The main control chip 16 provides the main functions of the embedded system 10a. Moreover, the main control chip 16 uses a digitalized control mechanism. The input/output port 13 is a transmission port for transmitting digital signals between the main control chip 16 and the internal components of the power supply apparatus 1. Consequently, the operating information of the power supply apparatus 1 is provided to the main control chip 16 through the input/output port 13. Moreover, the main control chip 16 controls the power supply apparatus 1 through the input/output port 13. An example of the memory 14 includes but not limited to a non-volatile memory (NVM). The analog-to-digital converter 15 is used for converting analog signals into digital signals. The communication interface 17 is electrically connected with the main control chip 16 and electrically connected with the connection interface 12. Consequently, the main control chip 16 is in communication with the external load through the communication interface 17 and the connection interface 12.

In this embodiment, the embedded system 10a of the control unit 10 receives a plurality of operating variables of the power supply apparatus 1. In an embodiment, the operating variables include analog signal variables such as voltages or currents. The analog signal variables are obtained through a plurality of sampling units (not shown) of the power supply apparatus 1. In another embodiment, the operating variables are digital signal variables. The digital signal variables include the memory values of the program that is executed in the main control chip 16 of the embedded system 10a, e.g., the values of the in-chip/off-chip resource registers of the main control chip 16 and/or the intermediate variables or the output results of PI controllers or other complicated algorithms. Alternatively, the digital signal variables include the signals that are received through the input/output port 13.

Please refer to FIG. 1 again. The time-sharing wave recording method includes the following steps. Firstly, in a step S1, a plurality of operating variables are defined in the embedded system 10a of the power supply apparatus 1, N1 specified operating variables to be recorded are selected from the plurality of operating variables, and the storage addresses of the N1 specified operating variables are mapped to N1 index variables (ValueN1), wherein N1 is a positive integer.

In the step S1, since the operating variables in the power supply apparatus 1 are various, the plurality of operating variables are previously defined in the embedded system 10a of the power supply apparatus 1 according to the practical requirements and are referred to as predefined operating variables. Then, the N1 specified operating variables to be recorded are selected from the plurality of predefined operating variables.

Then, in a step S2, the embedded system 10a provides N2 record channels CHN2[ ] in a sequential relationship. The mapping relationship between each record channel and arbitrarily-selected index variables of the N1 index variables is established, wherein N2 is a positive integer.

Figure 4:
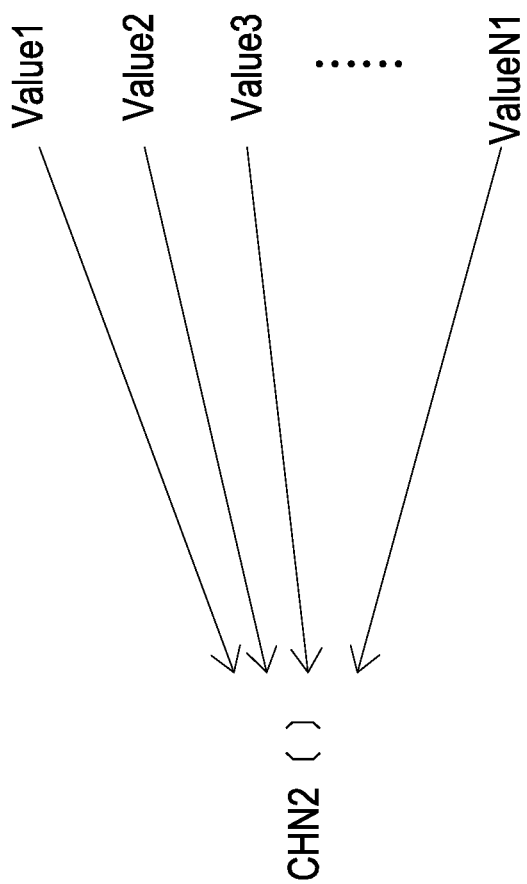
FIG. 4 schematically illustrates the mapping relationship between each record channel and the index variables in the step S2 of the time-sharing wave recording method as shown in FIG. 3.

FIG. 4 schematically illustrates the mapping relationship between each record channel and the index variables in the step S2 of the time-sharing wave recording method as shown in FIG. 3. As shown in FIG. 4, the mapping relationship between each record channel and the index variables is a one-to-multiple relationship. That is, each record channel may be mapped to one of the plurality of index variables, and the same index variable may be mapped to different record channels.

Figure 5:
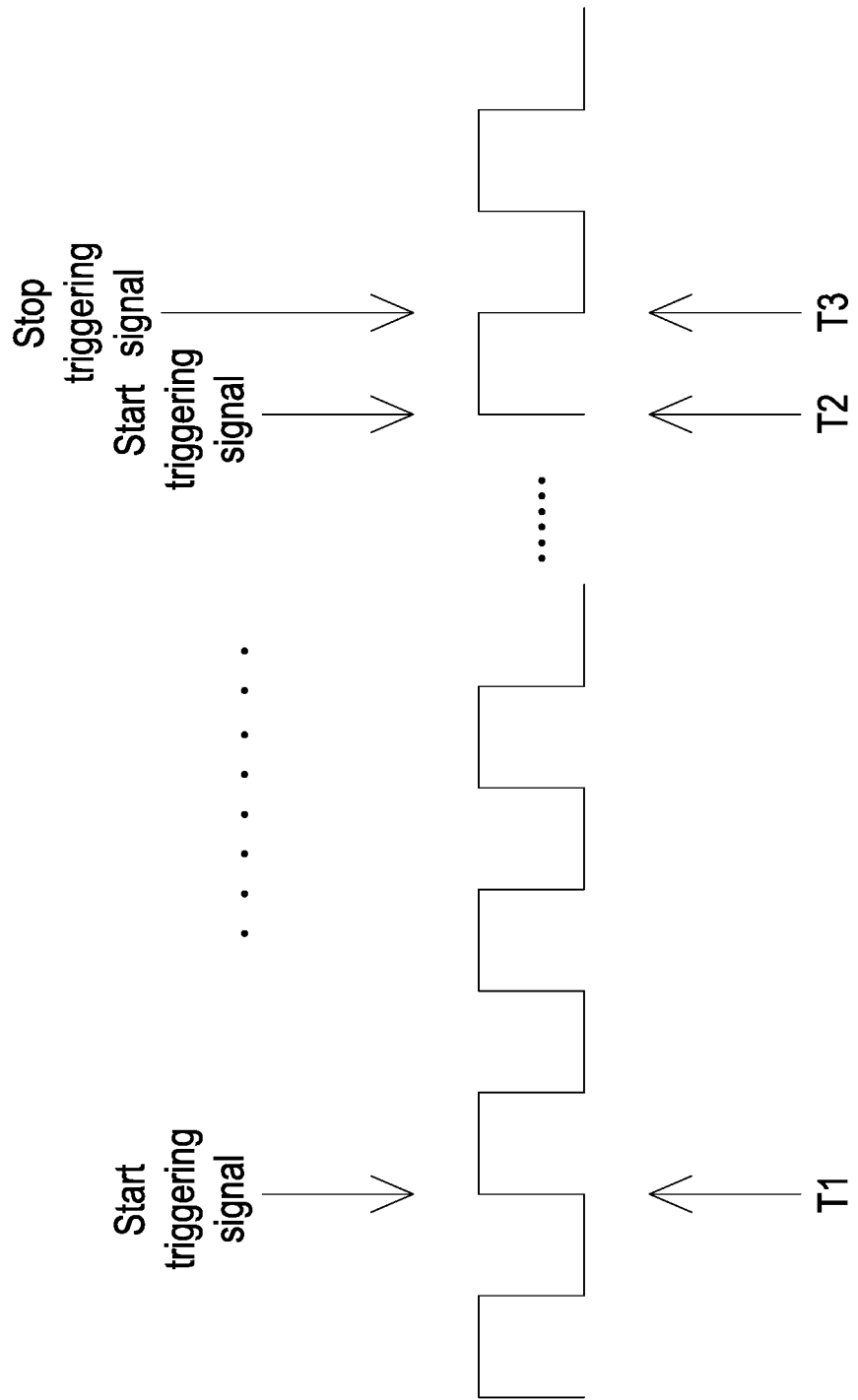
FIG. 5 is schematic timing waveform diagram illustrating a clock signal with a plurality of pulses provided by the embedded system and a start triggering signal and a stop triggering signal received by the embedded system.

FIG. 5 is schematic timing waveform diagram illustrating a clock signal with a plurality of pulses provided by the embedded system and a start triggering signal and a stop triggering signal received by the embedded system. After the step S2, a step S3 is performed. At the time point T1 corresponding to a rising edge of a pulse of the clock signal from the embedded system 10a, the embedded system 10a receives a start triggering signal. In response to the rising edge of the pulse of the clock signal and the start triggering signal, the values of the operating variables corresponding to the mapped index variables are assigned to the first record channel of the N2 record channels. In response to the rising edge of the next pulse of the clock signal and the start triggering signal, the values of the operating variables corresponding to the mapped index variables are assigned to the second record channel of the N2 record channels. During the time period between the time point T1 and the time point T2, the rest may be deduced by analogy. The values of the operating variables assigned to the record channels are stored in the memory 14. Consequently, the wave recording process is performed. At the time point T3, the embedded system 10a receives a stop triggering signal. In response to the stop triggering signal, the procedure of assigning the values of the operating variables corresponding to the mapped index variables to the record channels is stopped so that the wave recording process is ended.

In the step S3, the start triggering signal is generated when a pulse width modulation (PWM) signal is generated in the power supply apparatus 1 (e.g., the PWM signal is generated in the power unit 11 and used to control the operations of the switch elements of the power unit 11) or the embedded system 10a is enabled to start the wave recording task. The stop triggering signal is generated when the power supply apparatus 1 stops generating the PWM signal, the wave recording task of the embedded system 10a is disabled, the embedded system 10a detects an abnormal condition of the power supply apparatus 1 or the time period of performing the wave recording task by the embedded system 10a reaches a predetermined time length. Moreover, in response to the rising edge of each pulse of the clock signal and the start triggering signal, the values of the operating variables corresponding to the mapped index variables are assigned to one corresponding record channel.

In an embodiment of the step S3, whenever any record channel is given with the values of the operating variables, the values of the operating variables assigned to the record channel are stored in the memory 14. Alternatively, after all record channels are given with the values of the operating variables, the values of the operating variables assigned to the record channels are collaboratively stored in the memory 14.

FIG. 6 is a matrix indicating the record results of (M+1) discrete sampling operations of the N2 record channels. Please refer to FIGS. 1 to 4 and FIG. 6. In the step S3, (M+1) discrete sampling operations are performed on each record channel. The term "discrete sampling" means that the operating variables corresponding to the index variables for each record channel in the (M+1) sampling operations are not continuous. The reason is that the values are assigned in a sequence from the first record channel to the N2-th record channel. The value of the operating variable assigned to each record channel at each time (i.e., the sampled value of the record channel at each discrete sampling operation) is selected from the sampled values of the operating variables corresponding to the mapped index variables. Consequently, after (M+1) discrete sampling operations of the N2 channels are completed, the matrix as shown in FIG. 6 is obtained, wherein M is a natural number. Moreover, the (M+1) discrete sampling operations of each record channel may indicate that the sample values of the same operating variables corresponding to each record channel are recorded at different time points for (M+1) times. For example, the output voltage (i.e., an operating variable) corresponding to a specified record channel may be recorded at different time points for (M+1) times.

Please refer to FIG. 6 and the step S3 of FIG. 1. After the value of the operating variable corresponding to the index variable is assigned to the N2-th record channel, the value of the operating variable corresponding to the index variable is assigned to the first record channel again in response to the rising edge of the next pulse of the clock signal and the start triggering signal. For example, the values of the operating variables are assigned to the N2 record channels CH1[0], CH2[0], . . . , and CHN2[0] sequentially. Then, the values of the operating variables are assigned to the N2 record channels CH1[1], CH2[1], . . . , and CHN2[1]. The rest may be deduced by analogy. Consequently, each record channel has been given with the operating variables corresponding to the index variables for (M+1) times. Moreover, the values assigned to each record channel from the first time to the (M+1)-th time are sequentially the sampled values (discretely-sampled values) of the operating variables corresponding to the mapped index variables for the record channel from the first time to the (M+1)-th time.

Figure 7:
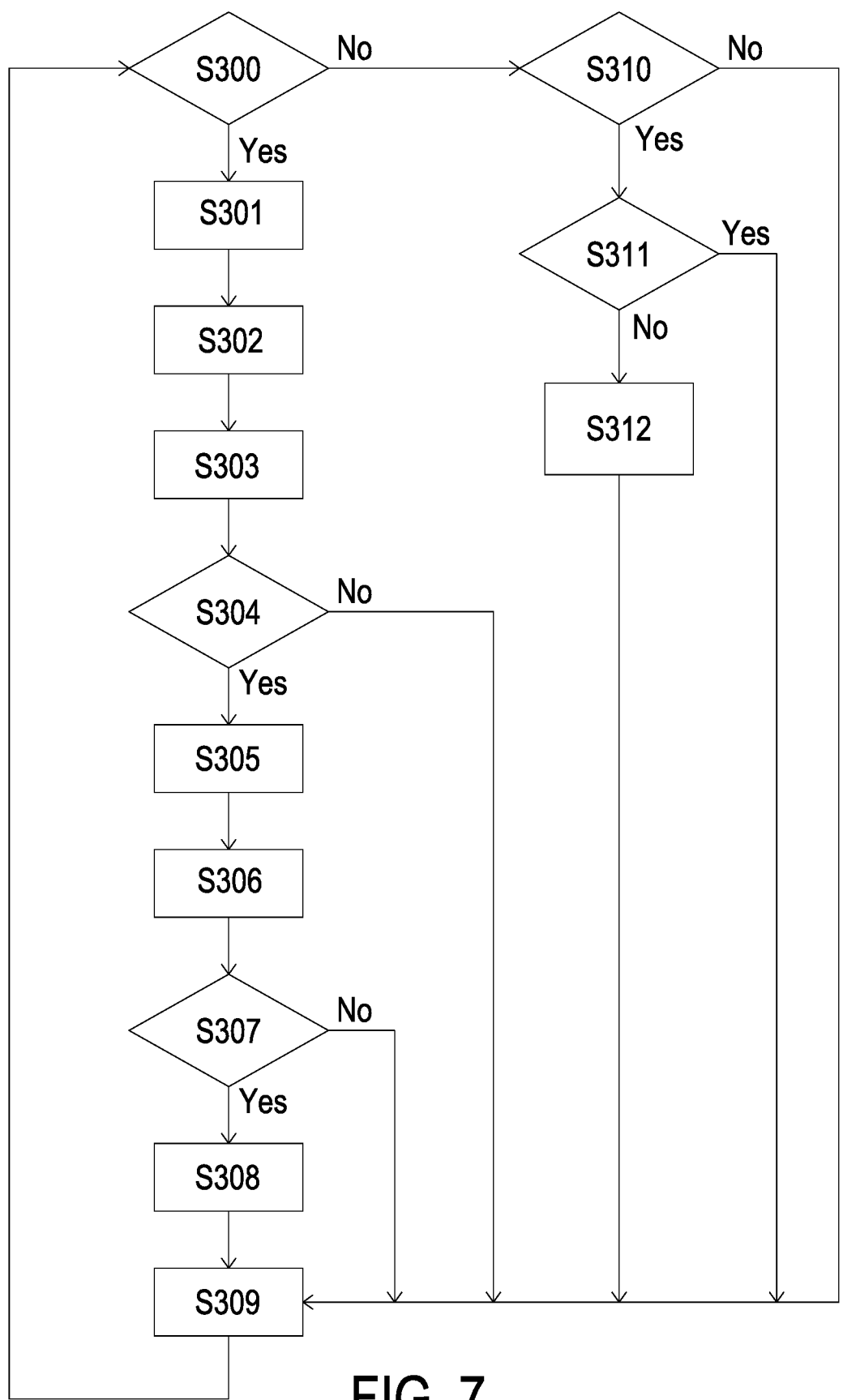
FIG. 7 is a flowchart illustrating the sub-steps of the step S3 of the time-sharing wave recording method as shown in FIG. 1.

FIG. 7 is a flowchart illustrating the sub-steps of the step S3 of the time-sharing wave recording method as shown in FIG. 1. As shown in FIG. 7, the step S3 includes sub-steps S300~S312.

Firstly, the sub-step S300 is performed to judge whether a start triggering signal is received in response to the rising edge of the pulse of a clock signal from the embedded system 10a.

If the judging condition of the sub-step S300 is satisfied, the sub-step S301 is performed. That is, the value of the operating variable corresponding to the mapped index variable is assigned to the i-th record channel at the (j+1) time, wherein the initial value of i is 1, and the initial value of j is 0. Then, the sub-step S302 is performed. That is, the value of the operating variable assigned to the i-th record channel at the (j+1) time is recorded to the memory 14. Then, in the sub-step S303, i is added by 1 (i=i+1). Then, the sub-step S304 is performed to judge whether i is larger than N2. If the judging condition of the sub-step S304 is satisfied, the sub-step S305 is performed. That is, i is restored to 1. Then, the sub-step S306 is performed to add 1 to j (j=j+1). Then, the sub-step S307 is performed to judge whether j is larger than M. If the judging condition of the sub-step S307 is satisfied, the sub-step S308 is performed to restore j to 0. Then, a next pulse of the clock signal is selected (sub-step S309), and the sub-step S300 is repeatedly done.

Whereas, if the judging condition of the sub-step S300 is not satisfied, the sub-step S310 is performed to judge whether a stop triggering signal is received. If the judging condition of the sub-step S310 is satisfied, the sub-step S311 is performed to judge whether the values of the operating variables corresponding to the index variables and assigned to all record channels for all record times have been stored in the memory 14. If the judging condition of the sub-step S311 is not satisfied, the sub-step S312 is performed. Meanwhile, the values of the operating variables corresponding to the index variables and assigned to all record channels for all record times are stored in the memory 14. After the sub-step S312 is completed, the sub-step S309 is performed.

Whereas, if the judging condition of the sub-step S304 is not satisfied, the sub-step S309 is performed. Similarly, if the judging condition of the sub-step S307 is not satisfied, the sub-step S309 is performed. Similarly, if the judging condition of the sub-step S310 is not satisfied, the sub-step S309 is performed. Similarly, if the judging condition of the sub-step S311 is satisfied, the sub-step S309 is performed.

From above descriptions, the present application provides a time-sharing wave recording method for an embedded system of a power supply apparatus. Since the power supply apparatus is not additionally equipped with a wave recording device to record the operating data of the power supply apparatus, the associated cost and time are saved. Since the time-sharing wave recording method is applied to the embedded system of the control unit of the power supply apparatus, the control unit may acquire the operating variables of the power supply apparatus and even record and track the operating variables. In the stage of testing the power supply apparatus, the operating variables may be further analyzed and read. Moreover, the embedded system can acquire the operating variables in the environment of the power supply apparatus (voltages, currents or other physical quantities of the environment). Consequently, during the cooperative operations of the power supply apparatus and the external load, the fault waveforms of the power supply apparatus and the external load can be stored.

While the application has been described in terms of what is presently considered to be the most practical and preferred embodiments, it is to be understood that the application needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A time-sharing wave recording method for an embedded system of a control unit of a power supply apparatus, the embedded system comprising a memory, the time-sharing wave recording method comprising steps of:
   (a) defining a plurality of operating variables in the embedded system, selecting N1 operating variables from the plurality of operating variables so as to be recorded, and mapping storage addresses of the N1 operating variables to N1 index variables, wherein N1 is a positive integer;
   (b) providing N2 record channels in a sequential relationship, and establishing a mapping relationship between each record channel and arbitrarily-selected index variables of the N1 index variables, wherein N2 is a positive integer; and
   (c) assigning values of the operating variables corresponding to the mapped index variables to a first record channel of the N2 record channels in response to a rising edge of a pulse of a clock signal from the embedded system and a start triggering signal, sequentially assigning values of the operating variables corresponding to the mapped index variables to the rest of the N2 record channels in response to a rising edge of each pulse of the clock signal and the start triggering signal, and recording the assigned values of the operating variables for the N2 record channels to the memory, wherein the procedure of assigning the values of the operating variables to the record channels is stopped in response to a stop triggering signal,
   wherein the step (c) comprises sub-steps of:
   (c1) judging whether the start trigger signal is received in response to the rising edge of the pulse of the clock signal from the embedded system;
   (c2) assigning the value of the operating variable corresponding to the mapped index variable to the i-th record channel at the (j+1) time, wherein an initial value of 1, and an initial value of j is 0;
   (c3) allowing the value of the operating variable assigned to the i-th record channel at the (j+1) time to be recorded to the memory;
   (c4) adding 1 to i;
   (c5) judging whether i is larger than N2;
   (c6) restoring 1 to i;
   (c7) adding 1 to j;
   (c8) judging whether j is larger than M;
   (c9) restoring j to 0;
   (c10) judge whether the stop triggering signal is received in response to the rising edge of the pulse of the clock signal from the embedded system;
   (c11) judging whether the values of the operating variables corresponding to the index variables and assigned to all record channels for all record times have been stored in the memory;
   (c12) allowing the values of the operating variables corresponding to the index variables and assigned to all record channels for all record times to be stored in the menory; and
   (c13) selecting the next pulse, and performing the step (c1) again,
   wherein if a judging condition of the step (c1) is satisfied, the steps (c2), (c3), (c4) and (c5) are performed sequentially, wherein if a judging condition of the step (c5) is satisfied, the steps (c6), (c7) and (c8) are performed sequentially, wherein if a judging condition of the step (c8) is satisfied, the steps (c9) and (c13) are performed sequentially, wherein if the judging condition of the step (c1) is not satisfied, the step (c10) is performed, wherein if a judging condition of the step (c10) is satisfied, the step (c11) is performed, wherein if a judging condition of the step (c11) is not satisfied, the steps (c12) and (c13) are performed sequentially, wherein if the judging condition of the step (c5) is not satisfied, the step (c13) is performed, wherein if the judging condition of the step (c8) is not satisfied, the step (c13) is performed, wherein if the judging condition of the step (c10) is not satisfied, the step (c13) is performed, wherein if the judging condition of the step (c11) is satisfied, the step (c13) is performed.

2. The time-sharing wave recording method according to claim 1, wherein in the step (c), (M+1) discrete sampling operations are performed on each record channel, and the value of the operating variable assigned to each record channel and at each time is selected from the sampled values of the operating variables corresponding to the mapped index variables, wherein M is a natural number.

3. The time-sharing wave recording method according to claim 2, wherein after the value of the operating variable corresponding to the index variable is assigned to the N2-th record channel in the step (c), the value of the operating variable corresponding to the index variable is assigned to the first record channel again in response to a rising edge of the next pulse of the clock signal and the start triggering signal, wherein each record channel has been given with the operating variables corresponding to the index variables for (M+1) times, and the values assigned to each record channel from the first time to the (M+1)-th time are sequentially the sampled values of the operating variables corresponding to the mapped index variables for the record channel from the first time to the (M+1)-th time.

4. The time-sharing wave recording method according to claim 1, wherein the memory is a non-volatile memory.

5. The time-sharing wave recording method according to claim 1, wherein the start triggering signal is generated when a pulse width modulation signal is generated in the power supply apparatus or the embedded system is enabled to start a wave recording task.

6. The time-sharing wave recording method according to claim 1, wherein the stop triggering signal is generated when the power supply apparatus stops generating a pulse width modulation signal, a wave recording task of the embedded system is disabled, the embedded system detects an abnormal condition of the power supply apparatus, or a time period of performing the wave recording task reaches a predetermined time length.

7. The time-sharing wave recording method according to claim 1, wherein the operating variables are analog signal variables.

8. The time-sharing wave recording method according to claim 1, wherein the operating variables are digital signal variables.

9. The time-sharing wave recording method according to claim 1, wherein in the step (c), whenever any record channel is given with the values of the operating variables, the values of the operating variables assigned to the record channel are stored in the memory.

10. The time-sharing wave recording method according to claim 1, wherein in the step (c), after all record channels are given with the values of the operating variables, the values of the operating variables assigned to the record channels are collaboratively stored in the memory.

\* \* \* \* \*